(12) United States Patent
Khlat

(10) Patent No.: US 10,361,744 B1
(45) Date of Patent: Jul. 23, 2019

(54) TRANSCEIVER CIRCUIT AND RELATED RADIO FREQUENCY CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/038,277

(22) Filed: Jul. 18, 2018

Related U.S. Application Data

(60) Provisional application No. 62/638,652, filed on Mar. 5, 2018.

(51) Int. Cl.

| | |
|---|---|
| H04B 1/40 | (2015.01) |
| H03F 1/32 | (2006.01) |
| H03F 1/02 | (2006.01) |
| H03F 3/193 | (2006.01) |
| H04B 17/13 | (2015.01) |
| H04B 1/04 | (2006.01) |
| H02M 3/156 | (2006.01) |

(52) U.S. Cl.
CPC .............. *H04B 1/40* (2013.01); *H02M 3/156* (2013.01); *H03F 1/0227* (2013.01); *H03F 1/3205* (2013.01); *H03F 3/193* (2013.01); *H04B 1/0475* (2013.01); *H04B 17/13* (2015.01)

(58) Field of Classification Search
CPC .................................................. H03F 2200/451
See application file for complete search history.

(56) References Cited

U.S. PATENT DOCUMENTS

| | | | | |
|---|---|---|---|---|
| 2012/0071125 | A1* | 3/2012 | Eken ...................... | G01R 19/02 455/226.2 |
| 2013/0109441 | A1* | 5/2013 | Lorenz .................. | H04W 88/02 455/571 |
| 2014/0184334 | A1* | 7/2014 | Nobbe .................. | H03F 1/0227 330/291 |
| 2014/0306763 | A1* | 10/2014 | Hong ...................... | H03F 3/195 330/291 |
| 2014/0361837 | A1* | 12/2014 | Strange ................. | H03F 1/0222 330/297 |
| 2016/0156317 | A1* | 6/2016 | Inoue .................... | H03F 1/0233 330/291 |
| 2016/0308551 | A1* | 10/2016 | Talty ...................... | H04L 1/0071 |
| 2016/0315794 | A1* | 10/2016 | Talty ..................... | H03M 3/438 |

(Continued)

*Primary Examiner* — Adam D Houston
(74) *Attorney, Agent, or Firm* — Withrow & Terranova, P.L.L.C.

(57) ABSTRACT

A transceiver circuit and related radio frequency (RF) circuit are provided. An RF circuit is coupled to a transceiver circuit configured to generate an envelope tracking (ET) target voltage. The RF circuit includes a tracker circuit and a power amplifier circuit(s). The tracker circuit may have inherent frequency-dependent impedance that can interact with a load current of the amplifier circuit(s) to cause degradation in an ET modulated voltage, which can lead to spectral distortions in an RF offset spectrum. As such, a voltage compensation circuit is provided in the transceiver circuit and configured to add a voltage compensation term in the ET target voltage. By adding the voltage compensation term into the ET target voltage, it is possible to compensate for the degradation in the ET modulated voltage, thus helping to reduce the spectral distortions in the RF offset spectrum and improve linearity and efficiency of the amplifier circuit(s).

23 Claims, 6 Drawing Sheets

(56) References Cited

U.S. PATENT DOCUMENTS

| | | | |
|---|---|---|---|
| 2016/0337979 A1* | 11/2016 | Talty | H04B 1/3822 |
| 2018/0048265 A1* | 2/2018 | Nentwig | H03F 1/0211 |
| 2018/0175809 A1* | 6/2018 | Zai | H03F 1/3247 |
| 2018/0183387 A1* | 6/2018 | Schemmann | H03F 1/0205 |
| 2018/0205346 A1* | 7/2018 | De Falco | H03F 1/0288 |

\* cited by examiner

US 10,361,744 B1

TRANSCEIVER CIRCUIT AND RELATED RADIO FREQUENCY CIRCUIT

RELATED APPLICATIONS

This application claims the benefit of provisional patent application Ser. No. 62/638,652, filed Mar. 5, 2018, the disclosure of which is hereby incorporated herein by reference in its entirety.

FIELD OF THE DISCLOSURE

The technology of the disclosure relates generally to radio frequency (RF) transceiver and front-end circuits.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires a higher data rate offered by wireless communication technologies, such as fifth generation new radio (5G-NR) and Wi-Fi that typically operates in higher frequency spectrums. To achieve higher data rates with increased robustness in the higher frequency spectrums, sophisticated power amplifiers (PAs) may be employed to increase output power of radio frequency (RF) signals (e.g., maintaining sufficient energy per bit) prior to transmitting the RF signals.

Envelope tracking (ET) is a power management technology designed to improve efficiency levels of the PAs to help reduce power dissipation in the mobile communication devices. As the name suggests, an ET circuit is configured to generate a modulated voltage that keeps track of a target voltage envelope and provide the modulated voltage to the PAs for amplifying the RF signal(s). However, the ET circuit has inherent output impedance that can interact with an inherent load of the PAs, particularly at a higher modulation bandwidth (e.g., >100 MHz). Consequently, the modulated voltage may be degraded, thus leading to distortions being created outside the modulation bandwidth. As such, it may be desirable to control the output impedance of the ET circuit to help reduce the distortions associated with the higher modulation bandwidth.

SUMMARY

Embodiments of the disclosure relate to a transceiver circuit and related radio frequency (RF) circuit. In examples discussed herein, an RF circuit is coupled to a transceiver circuit configured to generate an envelope tracking (ET) target voltage. The RF circuit includes a tracker circuit, which generates an ET modulated voltage at a wide modulation bandwidth (e.g., up to 160 MHz) based on the ET target voltage, and a power amplifier circuit(s) configured to amplify an RF signal based on the ET modulated voltage. Notably, the tracker circuit may have inherent frequency-dependent impedance that can interact with a load current of the amplifier circuit(s) to cause degradation in the ET modulated voltage, which can further lead to spectral distortions in an RF offset spectrum. As such, a voltage compensation circuit is provided in the transceiver circuit and configured to add a voltage compensation term (e.g., based on an estimated load current) in the ET target voltage. By adding the voltage compensation term into the ET target voltage, it is possible to compensate for the degradation in the ET modulated voltage, thus helping to reduce the spectral distortions in the RF offset spectrum and improve linearity and efficiency of the amplifier circuit(s).

In one aspect, a transceiver circuit is provided. The transceiver circuit includes an output node coupled to an RF circuit. The transceiver circuit also includes a voltage generation circuit coupled to the output node. The voltage generation circuit is configured to receive a number of digital amplitudes. The voltage generation circuit is also configured to generate a digital target voltage based on the number of digital amplitudes. The transceiver circuit also includes a voltage compensation circuit provided in parallel to the voltage generation circuit. The voltage compensation circuit is configured to generate a voltage compensation term based on the number of digital amplitudes. The digital target voltage is combined with the voltage compensation term prior to the digital target voltage being converted into an ET target voltage at the output node.

In another aspect, an apparatus is provided. The apparatus includes a transceiver circuit. The transceiver circuit includes an output node coupled to an RF circuit. The transceiver circuit also includes a voltage generation circuit coupled to the output node. The voltage generation circuit is configured to receive a number of digital amplitudes. The voltage generation circuit is also configured to generate a digital target voltage based on the number of digital amplitudes. The transceiver circuit also includes a voltage compensation circuit provided in parallel to the voltage generation circuit. The voltage compensation circuit is configured to generate a voltage compensation term based on the number of digital amplitudes. The digital target voltage is combined with the voltage compensation term prior to the digital target voltage being converted into an ET target voltage at the output node. The apparatus also includes an RF circuit coupled to the output node. The RF circuit is configured to receive the ET target voltage.

In another aspect, an RF circuit is provided. The RF circuit includes a power amplifier circuit configured to amplify an RF signal based on an ET modulated voltage. The ET modulated voltage includes a first voltage term and a second voltage term. The RF circuit also includes a tracker circuit. The tracker circuit is configured to generate the ET modulated voltage based on an ET target voltage. The tracker circuit is also configured to generate a voltage correction term to compensate for a voltage distortion associated with the first voltage term of the ET modulated voltage.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
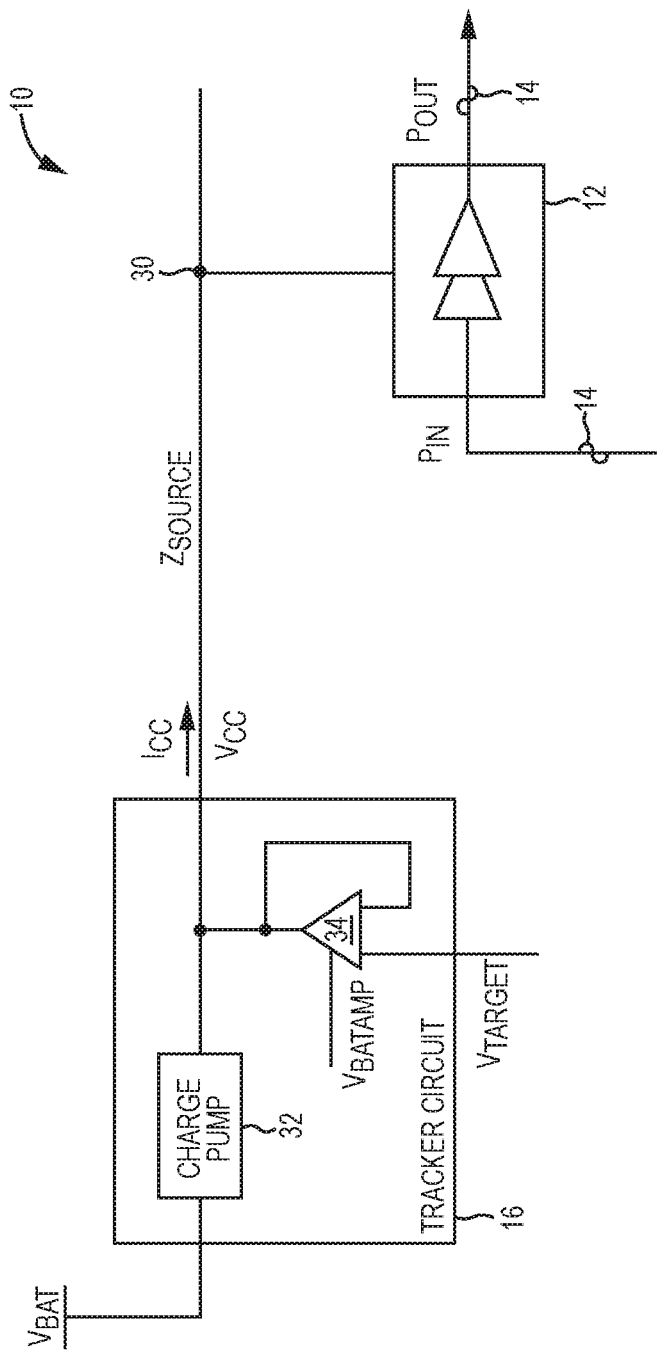
FIG. 1A is a schematic diagram of an exemplary radio frequency (RF) circuit in which an amplifier circuit is configured to amplify an RF signal based on a modulated voltage generated by a tracker circuit.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a transceiver circuit and related radio frequency (RF) circuit. In examples discussed herein, an RF circuit is coupled to a transceiver circuit configured to generate an envelope tracking (ET) target voltage. The RF circuit includes a tracker circuit, which generates an ET modulated voltage at a wide modulation bandwidth (e.g., up to 160 MHz) based on the ET target voltage, and a power amplifier circuit(s) configured to amplify an RF signal based on the ET modulated voltage. Notably, the tracker circuit may have inherent frequency-dependent impedance that can interact with a load current of the amplifier circuit(s) to cause degradation in the ET modulated voltage, which can further lead to spectral distortions in an RF offset spectrum. As such, a voltage compensation circuit is provided in the transceiver circuit and configured to add a voltage compensation term (e.g., based on an estimated load current) in the ET target voltage. By adding the voltage compensation term into the ET target voltage, it is possible to compensate for the degradation in the ET modulated voltage, thus helping to reduce the spectral distortions in the RF offset spectrum and improve linearity and efficiency of the amplifier circuit(s).

Before discussing the transceiver circuit and the related RF circuit of the present disclosure, a brief overview of an RF circuit is first discussed with reference to FIGS. 1A-1E to help understand common issues related to supporting wide bandwidth modulation in the RF circuit. The discussion of specific exemplary aspects of a transceiver circuit and related RF circuit that can be configured to overcome the common issues in the RF circuit starts below with reference to FIG. 2.

In this regard, FIG. 1A is a schematic diagram of an exemplary RF circuit 10 in which a power amplifier circuit 12 is configured to amplify an RF signal 14 from an input power $P_{IN}$ to an output power $P_{OUT}$ based on an ET modulated voltage $V_{CC}$ generated by a tracker circuit 16. The power amplifier circuit 12 can be configured to operate as a linear or a nonlinear device based on a power amplifier (PA) characteristic curve 18, which is discussed next with reference to FIG. 1B.

Figure 1B:
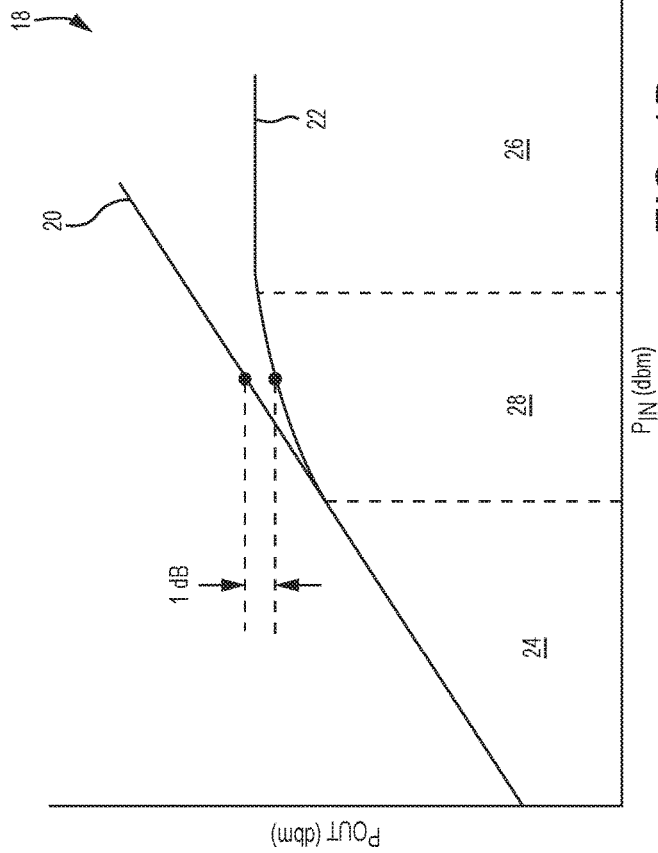
FIG. 1B is a graphic diagram providing an exemplary illustration of a characteristic curve of the amplifier circuit of FIG. 1A.

With reference to FIG. 1B, the PA characteristic curve 18 includes a theoretical response curve 20, which represents a theoretical relationship between the output power $P_{OUT}$ and the input power $P_{IN}$, and an actual response curve 22, which represents an actual relationship between the output power $P_{OUT}$ and the input power $P_{IN}$. As shown in FIG. 1B, the power amplifier circuit 12 may be configured to operate in a linear region 24 or a compression region 26. When the power amplifier circuit 12 operates in a linear region 24, the output power $P_{OUT}$ will be linearly related to the input power $P_{IN}$ and a power gain (G) of the power amplifier circuit 12, as indicated by the theoretical response curve 20. In contrast, when the power amplifier circuit 12 operates in the compression region 26, the output power $P_{OUT}$ is no longer responding to an increase in the input power $P_{IN}$. As such, the output power $P_{OUT}$ may be controlled via the ET modulated voltage $V_{CC}$. More often than not, the power amplifier circuit 12 may operate in a nonlinear region 28 in between the linear region 24 and the compression region 26. In this regard, the output power $P_{OUT}$ is nonlinearly related to the input power $P_{IN}$ in accordance to the actual response curve 22 in the nonlinear region 28.

With reference back to FIG. 1A, the tracker circuit 16 includes an inherent source impedance $Z_{SOURCE}$. In a non-limiting example, the source impedance $Z_{SOURCE}$ represents combined impedance as seen by the power amplifier circuit 12 when looking from a coupling point 30 into the tracker circuit 16.

In a non-limiting example, the power amplifier circuit 12 can be modeled as a current source. In this regard, the source impedance $Z_{SOURCE}$ and the ET modulated voltage $V_{CC}$ may cause a load current $I_{CC}$ in the power amplifier circuit 12. As previously discussed in FIG. 1B, the power amplifier circuit 12 may operate in the linear region 24, the nonlinear region 28, or the compression region 26. When the power amplifier circuit 12 operates in the linear region 24, the load current $I_{CC}$ is non-proportional to the ET modulated voltage $V_{CC}$ (hereinafter referred to as "non-proportional load current $I_{CC\_NP}$"). In this regard, the load current $I_{CC}$ may be dominated by the non-proportional load current $I_{CC\_NP}$. In contrast, when the power amplifier circuit 12 operates in the compression region 26, the load current $I_{CC}$ is proportional to the ET modulated voltage $V_{CC}$ (hereinafter referred to as "proportional load current $I_{CC\_P}$"). In this regard, the load current $I_{CC}$ may be dominated by the proportional load current $I_{CC\_P}$. Furthermore, when the power amplifier circuit 12 operates in the nonlinear region 28, the load current $I_{CC}$ may consist of both the proportional load current $I_{CC\_P}$ and the non-proportional load current $I_{CC\_NP}$.

The tracker circuit 16 may include charge pump circuitry 32 and an amplifier 34. The charge pump circuitry 32 is coupled to a battery voltage $V_{BAT}$ and configured to generate the load current $I_{CC}$, which may include both a direct current and an alternating current. The amplifier 34 receives a supply voltage $V_{BATAMP}$, which can be derived from the battery voltage $V_{BAT}$. The amplifier 34 may receive an ET target voltage $V_{TARGET}$ and generates the ET modulated voltage $V_{CC}$ based on the ET target voltage $V_{TARGET}$.

Notably, the RF signal 14 may be modulated to follow a time-variant power envelope that can produce a higher peak power from time to time. Accordingly, the tracker circuit 16 is required to provide the ET modulated voltage $V_{CC}$ and the current $I_{CC}$ at a sufficient level such that the power amplifier circuit 12 can amplify the RF signal 14 to the output power $P_{OUT}$ corresponding to the higher peak power of the time-variant power envelope. For example, the RF signal 14 can have a peak power in excess of 28.5 dBm and the power amplifier circuit 12 is required to amplify the RF signal 14 to a Class 2 output power in excess of 26 dBm. If the power amplifier circuit 12 has 45% power amplifier efficiency (PAE) and the ET modulated voltage $V_{CC}$ is at 5 V, the current $I_{CC}$ generated by the tracker circuit 16 would need to be approximately 314.6 mA. As such, the amplifier 34 needs to employ an output stage large enough to produce the required current $I_{CC}$.

Figure 1D:
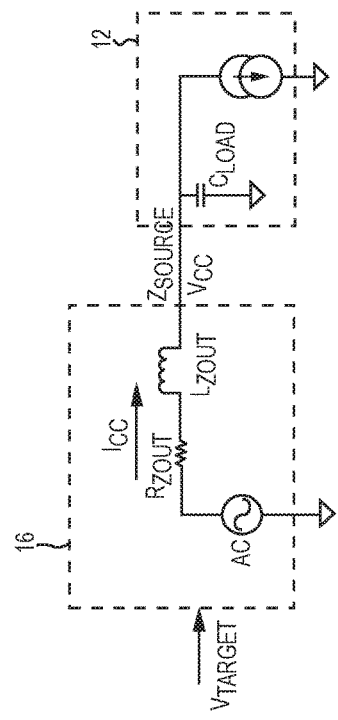
FIG. 1D is a schematic diagram showing that an output impedance of the tracker circuit of FIG. 1A can be modeled by an output inductance and an output resistance.
Figure 1C:
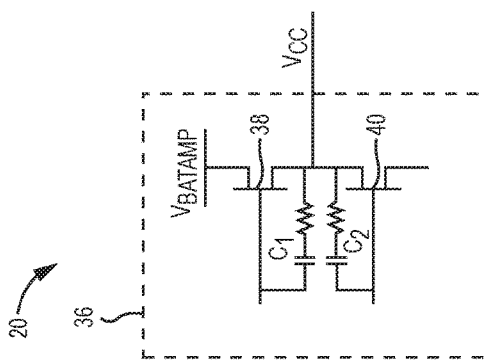
FIG. 1C is a schematic diagram providing an exemplary illustration of an output stage of tracker circuitry in the RF circuit of FIG. 1A.

FIG. 1C is a schematic diagram providing an exemplary illustration of an output stage 36 of the amplifier 34 in the RF circuit 10 of FIG. 1A. The output stage 36 includes a first transistor 38 and a second transistor 40 disposed in series. The first transistor 38 may be a p-type field-effect transistor (pFET) and the second transistor 40 may be an n-type field-effect transistor (nFET). When the supply voltage $V_{BATAMP}$ is applied to the output stage 36, the first transistor 38 and the second transistor 40 can produce parasitic capacitance. As such, a pair of balance capacitors $C_1$ and $C_2$ may be provided in the output stage 36 to help balance the parasitic capacitances.

As stated above, the output stage 36 needs to produce a sufficiently large current $I_{CC}$ such that the power amplifier circuit 12 of FIG. 1A can amplify the RF signal 14 to the output power $P_{OUT}$ corresponding to the higher peak power of the time-variant power envelope. In this regard, the first transistor 38 and the second transistor 40 need to be sufficiently large, which can in turn produce larger parasitic capacitance during operation. As a result, the balance capacitors $C_1$ and $C_2$ need to be bigger so as to provide a higher balance capacitance to balance the increased parasitic capacitance. The increased size of the first transistor 38, the second transistor 40, and the balance capacitors $C_1$ and $C_2$ can lead to a larger footprint and more power consumption of the output stage 36. In addition, the higher balance capacitance introduced by the balance capacitors $C_1$ and $C_2$ can reduce a slew rate of the amplifier 34, which in turn reduces voltage modulation bandwidth of the amplifier 34.

With reference back to FIG. 1A, the source impedance $Z_{SOURCE}$ may be modeled as being primarily determined by an output inductance $L_{ZOUT}$ and an output resistance $R_{ZOUT}$, as shown in FIG. 1D. FIG. 1D is a schematic diagram showing that the source impedance $Z_{SOURCE}$ of the tracker circuit 16 of FIG. 1A can be modeled by the output inductance $L_{ZOUT}$ and the output resistance $R_{ZOUT}$. Common elements between FIGS. 1A-1D are shown therein with common element numbers and will not be re-described herein.

Impact of source impedance $Z_{SOURCE}$ on the ET modulated output voltage $V_{CC}$ can be expressed in equation (Eq. 1) below.

$$V_{CC} = V_{TARGET} - L_{ZOUT} dI_{CC}/dt - R_{ZOUT} I_{CC} \qquad (\text{Eq. 1})$$

As shown in the equation (Eq. 1) above, the source impedance $Z_{SOURCE}$ can cause a voltage deviation between the ET target voltage $V_{TARGET}$ and the ET modulated voltage $V_{CC}$, which can be worsened when the RF signal 14 is modulated at a wider modulation bandwidth (e.g., up to 160 MHz). In addition, the source impedance $Z_{SOURCE}$ can increase power dissipation in the RF circuit 10. Furthermore, when capacitance of the balance capacitors $C_1$ and $C_2$ in the output stage 36 of the tracker circuit 16 increases, the source impedance $Z_{SOURCE}$ can increase as well, thus reducing a slew rate of the tracker circuit 16 and causing further deviation in the ET modulated voltage $V_{CC}$.

Figure 1E:
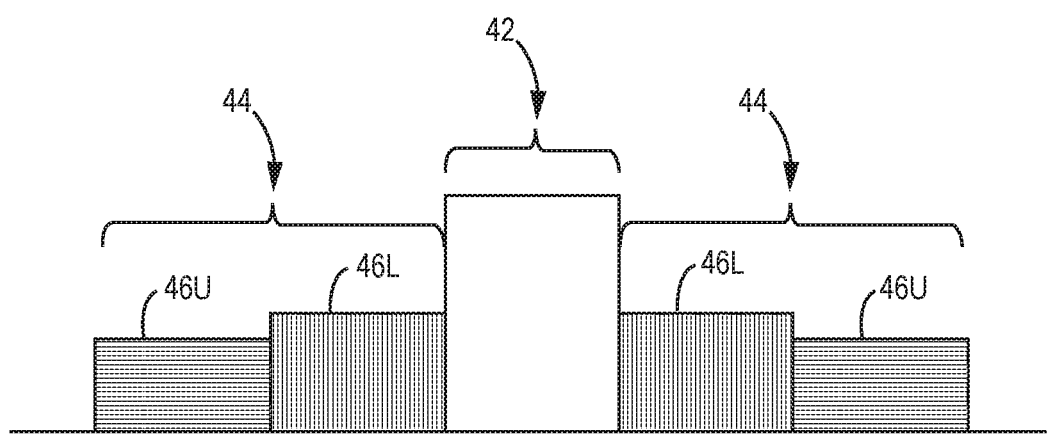
FIG. 1E is a schematic diagram providing an exemplary illustration of a time division duplex (TDD) RF spectrum and adjacent RF offset spectrums.

The power amplifier circuit 12 may be configured to amplify the RF signal 14 for transmission in a time division duplex (TDD) RF spectrum 42, as shown in FIG. 1E. The TDD RF spectrum 42 is adjacent to an RF offset spectrum 44, which can be located above or below the TDD RF spectrum 42, but not overlapping the TDD RF spectrum 42.

The RF offset spectrum 44 may include a lower offset spectrum 46L and an upper offset spectrum 46U. The lower offset spectrum 46L and the upper offset spectrum 46U can correspond to equal or different bandwidths. For example, if the TDD RF spectrum 42 has a 100 MHz bandwidth, the RF offset spectrum 44 can have a 200 MHz bandwidth divided equally or non-equally between the lower offset spectrum 46L and the upper offset spectrum 46U.

With reference back to FIG. 1A, the power amplifier circuit 12 may act as a current source to the tracker circuit 16. Notably, the current $I_{CC}$ may have a wide current spectrum, which can interact with the source impedance $Z_{SOURCE}$ to degrade the ET modulated voltage $V_{CC}$ and create significant energy content in the RF offset spectrum 44 as a result of spectral regrowth. Moreover, when the RF signal 14 is modulated at the wider modulation bandwidth, the source impedance $Z_{SOURCE}$ tends to increase, thus further degrading the ET modulated voltage $V_{CC}$ and worsening the distortions in the RF offset spectrum 44. As such, it may be desirable to control the source impedance $Z_{SOURCE}$ to help reduce distortions (e.g., noise and ripple) in the RF offset spectrum 44.

Figure 2:
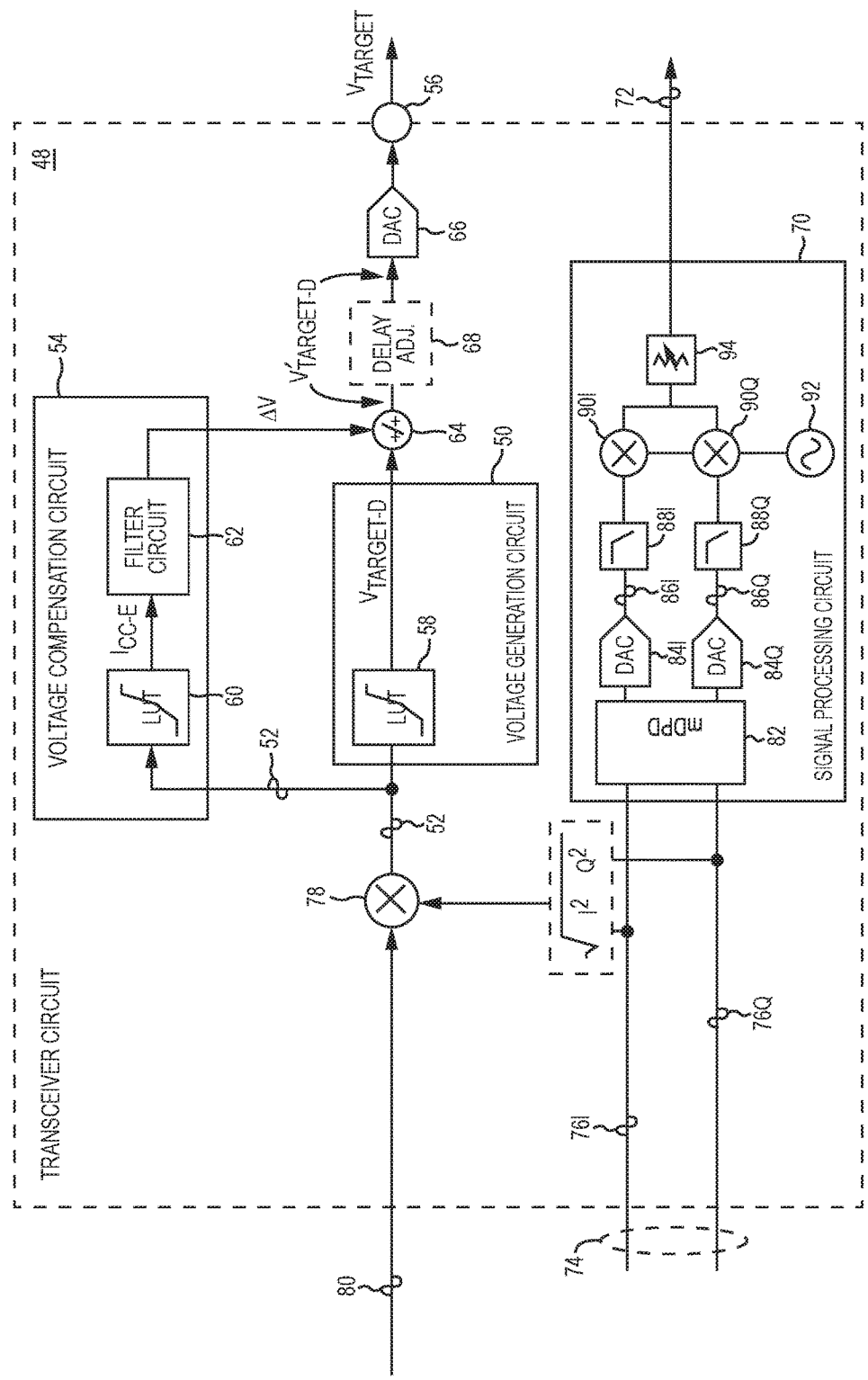
FIG. 2 is a schematic diagram of an exemplary transceiver circuit configured according to an embodiment of the present disclosure to digitally introduce a voltage compensation term into a digital target voltage to help reduce spectral distortions in the RF offset spectrum of FIG. 1E.

In this regard, FIG. 2 is a schematic diagram of an exemplary transceiver circuit 48 configured according to an embodiment of the present disclosure to digitally introduce a voltage compensation term $\Delta v$ into a digital target voltage $V_{TARGET\_D}$ to help reduce spectral distortions in the RF offset spectrum 44 of FIG. 1E. The transceiver circuit 48 includes a voltage generation circuit 50 configured to receive a number of digital amplitudes 52 and generate the digital target voltage $V_{TARGET\_D}$ based on the digital amplitudes 52. The transceiver circuit 48 further includes a voltage compensation circuit 54 that is provided in parallel to the voltage generation circuit 50. The voltage compensation circuit 54 is configured to generate the voltage compensation term $\Delta v$ based on the digital amplitudes 52. The voltage compensation term $\Delta v$ is combined with the digital target voltage $V_{TARGET\_D}$ prior to the digital target voltage $V_{TARGET\_D}$ being converted to an ET target voltage $V_{TARGET}$ for output at an output node 56.

As discussed in detail below, the voltage compensation term $\Delta v$ may be generated based on an estimated load current $I_{CC\_E}$ (e.g., an estimation of the load current $I_{CC}$ in FIG. 1A) to help compensate for degradation in the ET target voltage $V_{TARGET}$. Accordingly, it may be possible to correct potential distortions associated with an ET modulated voltage $V_{CC}$ that is generated by an RF circuit coupled to the output node 56 based on the ET target voltage $V_{TARGET}$. As a result, it may be possible to reduce the spectral distortions in the RF offset spectrum 44 of FIG. 1E.

The voltage generation circuit 50 includes a target voltage look-up table (LUT) 58, which can be an application-specific integrated circuit (ASIC) for example. The target voltage LUT 58 may include storage elements (e.g., registers) for storing predetermined digital target voltages in association with the digital amplitudes 52. The target voltage LUT 58 may also include processing elements (e.g., microprocessors) to generate the digital target voltage $V_{TARGET\_D}$ based on the digital amplitudes 52.

The voltage compensation circuit 54 includes a load current LUT 60, which can be an ASIC for example. The load current LUT 60 may include storage elements (e.g., registers) for storing the estimated load current $I_{CC\_E}$ in association with the digital amplitudes 52. The load current LUT 60 may also include processing elements (e.g., microprocessors) to generate the estimated load current $I_{CC\_E}$ based on the digital amplitudes 52. The voltage compensation circuit 54 also includes a filter circuit 62 configured to generate the voltage compensation term $\Delta v$ based on the estimated load current $I_{CC\_E}$.

The transceiver circuit 48 may include a voltage combiner 64 configured to combine the digital target voltage VTARGET_D with the voltage compensation term $\Delta v$ to generate a compensated digital target voltage $V'_{TARGET\_D}$. The transceiver circuit 48 includes a digital-to-analog converter (DAC) 66 configured to convert the compensated digital target voltage $V'_{TARGET\_D}$ into the ET target voltage $V_{TARGET}$ and provide the ET target voltage $V_{TARGET}$ to the output node 56. The DAC 66 may be configured to generate the ET target voltage $V_{TARGET}$ as a differential target voltage. The transceiver circuit 48 may also include a delay circuit 68 coupled between the voltage combiner 64 and the DAC 66.

The transceiver circuit 48 includes a signal processing circuit 70 configured to generate an RF signal 72 based on a digital signal 74. In a non-limiting example, the digital signal 74, which can be a digital baseband signal, includes a digital in-phase (I) signal 76I and a digital quadrature (Q) signal 76Q. The digital in-phase signal 76I and the digital quadrature signal 76Q correspond to an in-phase amplitude I and a quadrature amplitude Q, respectively. The in-phase amplitude I and the quadrature amplitude Q collectively define a number of digital amplitudes $\sqrt{I^2+Q^2}$. The transceiver circuit 48 may include a combiner 78, which combines the digital amplitudes $\sqrt{I^2+Q^2}$ with a digital reference signal 80 to generate the digital amplitudes 52.

The signal processing circuit 70 may include a memory digital pre-distortion (mDPD) circuit 82 configured to perform mDPD on the digital in-phase signal 76I and the digital quadrature signal 76Q. The signal processing circuit 70 includes an in-phase DAC 84I and a quadrature DAC 84Q that convert the digital in-phase signal 76I and the digital quadrature signal 76Q into an analog in-phase signal 86I and an analog quadrature signal 86Q, respectively. The signal processing circuit 70 may include an in-phase filter 88I and a quadrature filter 88Q for passing the analog in-phase signal 86I and the analog quadrature signal 86Q in a desired frequency band, respectively. The signal processing circuit 70 may include an in-phase multiplexer 90I and a quadrature mixture 90Q configured to convert the analog in-phase signal 86I and the analog quadrature signal 86Q to appropriate frequencies (e.g., carrier frequency or intermediate frequency). The in-phase multiplexer 90I and the quadrature mixture 90Q may be configured to operate based on a reference frequency provided by an oscillator 92. The signal processing circuit 70 includes a signal combiner 94 configured to combine the analog in-phase signal 86I and the analog quadrature signal 86Q to generate the RF signal 72.

Figure 3:
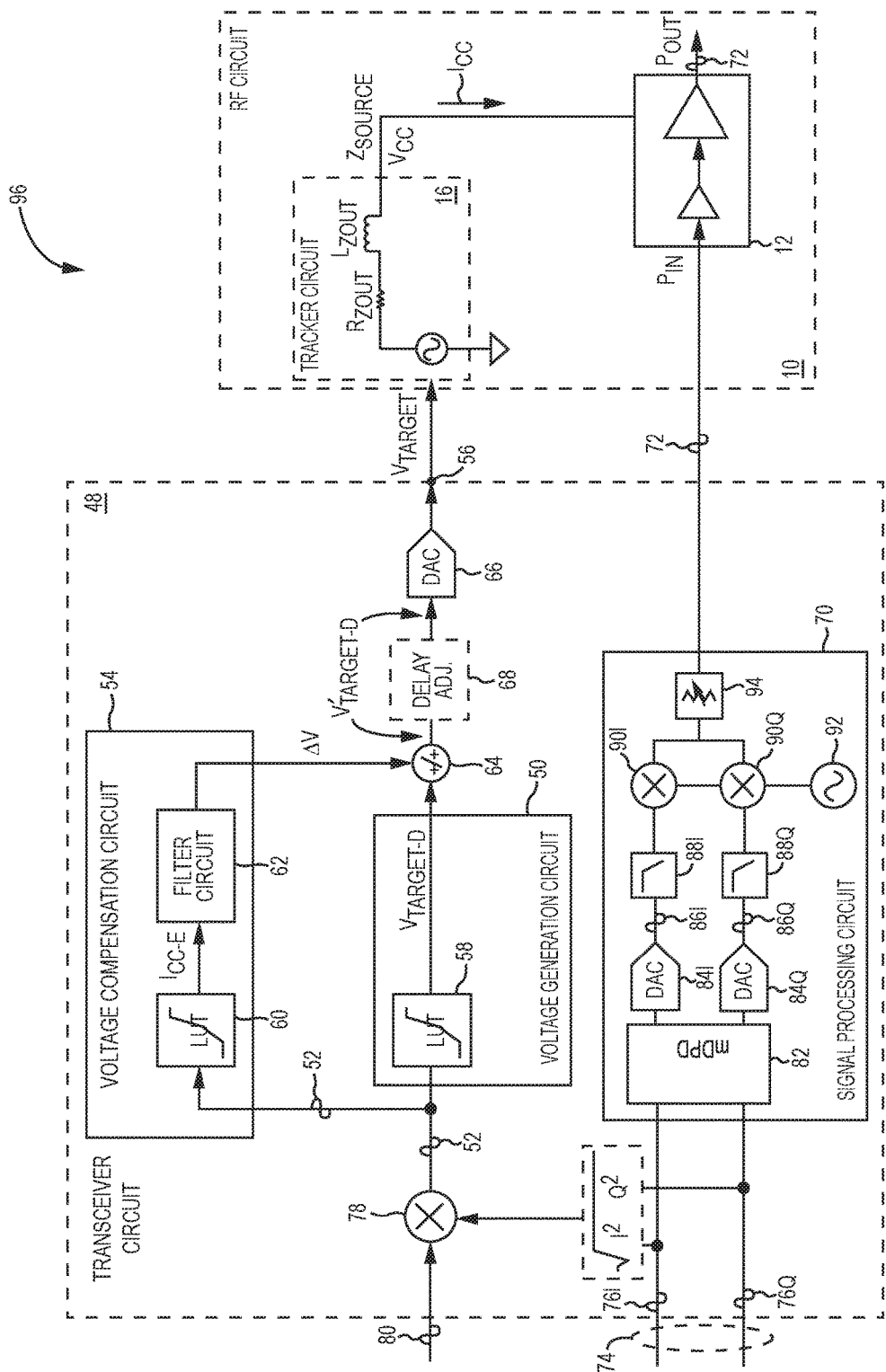
FIG. 3 is a schematic diagram of an exemplary apparatus incorporating the transceiver circuit of FIG. 2 and the RF circuit of FIG. 1A according to one embodiment of the present disclosure.

The transceiver circuit 48 may be provided in an apparatus (e.g., smartphone) to help reduce the spectral distortions in the RF offset spectrum 44 of FIG. 1E and improve linearity and efficiency of amplifier circuit(s) in the apparatus. In this regard, FIG. 3 is a schematic diagram of an exemplary apparatus 96 incorporating the transceiver circuit 48 of FIG. 2 and the RF circuit 10 of FIG. 1A according to one embodiment of the present disclosure. Common elements between FIGS. 1A, 2, and 3 are shown therein with common element numbers and will not be re-described herein.

The tracker circuit 16 is coupled to the output node 56 to receive the ET target $V_{TARGET}$ and generate the ET modulated voltage $V_{CC}$ based on the ET target voltage $V_{TARGET}$. The power amplifier circuit 12, which may be a single-stage or a multi-stage power amplifier circuit, is coupled to the transceiver circuit 48 to receive the RF signal 72. The power amplifier circuit 12 is also coupled to the tracker circuit 16 to receive the ET modulated voltage $V_{CC}$ and amplify the RF signal 72 based on the ET modulated voltage $V_{CC}$.

As previously discussed in FIGS. 1A-1E, the tracker circuit 16 includes the source impedance $Z_{SOURCE}$, which may be modeled as being primarily determined by the output inductance $L_{ZOUT}$ and the output resistance $R_{ZOUT}$, and can impact the ET modulated output voltage $V_{CC}$ as expressed in the equation (Eq. 1) above. Further according to previous discussions in FIGS. 1A-1E, the source impedance $Z_{SOURCE}$ can cause a voltage deviation between the ET target voltage $V_{TARGET}$ and the ET modulated voltage $V_{CC}$, which can be worsened when the RF signal 72 is modulated at a wider modulation bandwidth (e.g., up to 160 MHz).

The power amplifier circuit 12, on the other hand, can be modeled as a current source to the tracker circuit 16. In this regard, the source impedance $Z_{SOURCE}$ and the ET modulated voltage $V_{CC}$ may cause the load current $I_{CC}$ in the power amplifier circuit 12. As previously discussed in FIG. 1B, the power amplifier circuit 12 may operate in the linear region 24, the nonlinear region 28, or the compression region 26.

Depending on the PA characteristic (as shown in FIG. 1B) of the power amplifier circuit 12, the load current $I_{CC}$ may include the non-proportional load current $I_{CC\_NP}$ and/or the proportional load current $I_{CC\_P}$. In this regard, the load current LUT 60 may be configured to generate the estimated current $I_{CC\_E}$ to include both an estimated non-proportional load current $I_{CC\_NP}$ and an estimated proportional load current $I_{CC\_P}$.

Accordingly, the filter circuit 62 may be configured to generate the voltage compensation term $\Delta v$ based on a convolution of the estimated load current $I_{CC\_E}$ and a set of estimated source impedance impulse responses $Z_{SOURCE}(t)$ ($\Delta v = I_{CC\_E}(t) ** Z_{SOURCE}(t)$). More specifically, the filter circuit 62 may generate the voltage compensation term $\Delta v$ by performing a convolution function based on the estimated load current $I_{CC\_E}$ and the estimated impedance impulse responses $Z_{SOURCE}(t)$ that correspond to the RF circuit 10. The estimated impedance impulse responses $Z_{SOURCE}(t)$ may be determined based on design/characterization of the power amplifier circuit 12. For example, the estimated impedance impulse responses $Z_{SOURCE}(t)$ can be determined based on a convolution of a high-pass filter and the source impedance $Z_{SOURCE}$, which is known based on the design/characterization of the RF circuit 10.

The power amplifier circuit 12 may be treated as a 2-input circuit, wherein the 2-input circuit corresponds respectively to the ET modulated voltage $V_{CC}$ and the load current $I_{CC}$, which may consist of the proportional load current $I_{CC\_P}$ and/or the non-proportional load current $I_{CC\_NP}$. In this regard, the ET modulated voltage $V_{CC}$ may be expressed in equation (Eq. 2) below.

$$V_{CC} = H(S) * V_{TARGET} - I_{CC\_P} * Z_{SOURCE} - I_{CC\_NP} * Z_{SOURCE} \quad \text{(Eq. 2)}$$

In the equation (Eq. 2) above, H(s) represents a voltage transfer function associated with the tracker circuit 16. As shown in equation (Eq. 2), the ET modulated voltage $V_{CC}$ can be seen as including a first voltage term $V_{TERM1}$, which corresponds to the proportional load current $I_{CC\_P}$, and a second voltage term $V_{TERM2}$, which corresponds to the non-proportional load current $I_{CC\_NP}$. As such, the equation (Eq. 2) can be replaced by equations (Eq. 2.1, Eq. 2.2, and Eq. 2.3) below.

$$V_{CC} = V_{TERM1} + V_{TERM2} \quad \text{(Eq. 2.1)}$$

$$V_{TERM1} = H(S) * V_{TARGET} - I_{CC\_P} * Z_{SOURCE} \quad \text{(Eq. 2.2)}$$

$$V_{TERM2} = -I_{CC\_NP} * Z_{SOURCE} \quad \text{(Eq. 2.3)}$$

In this regard, the load current LUT 60 may be configured to generate the estimated load current $I_{CC\_E}$ that includes both an estimation for the proportional load current $I_{CC\_P}$ and an estimation for the non-proportional load current $I_{CC\_NP}$. Accordingly, the filter circuit 62 may be able to generate the voltage compensation term $\Delta v$ to compensate for a voltage distortion in the ET modulated voltage that is associated with both the first voltage term $V_{TERM1}$ and the second voltage term $V_{TERM2}$.

Given that the first voltage term $V_{TERM1}$, as shown in the equation (Eq. 2.2) above, is only related to the proportional load current $I_{CC\_P}$, it is possible to express the ET modulated voltage $V_{CC}$ in equation (Eq. 3) below.

$$V_{CC} = H(s) * V_{TARGET}/(1 + Z_{SOURCE}/R_{ICC}) \quad \text{(Eq. 3)}$$

Figure 4:
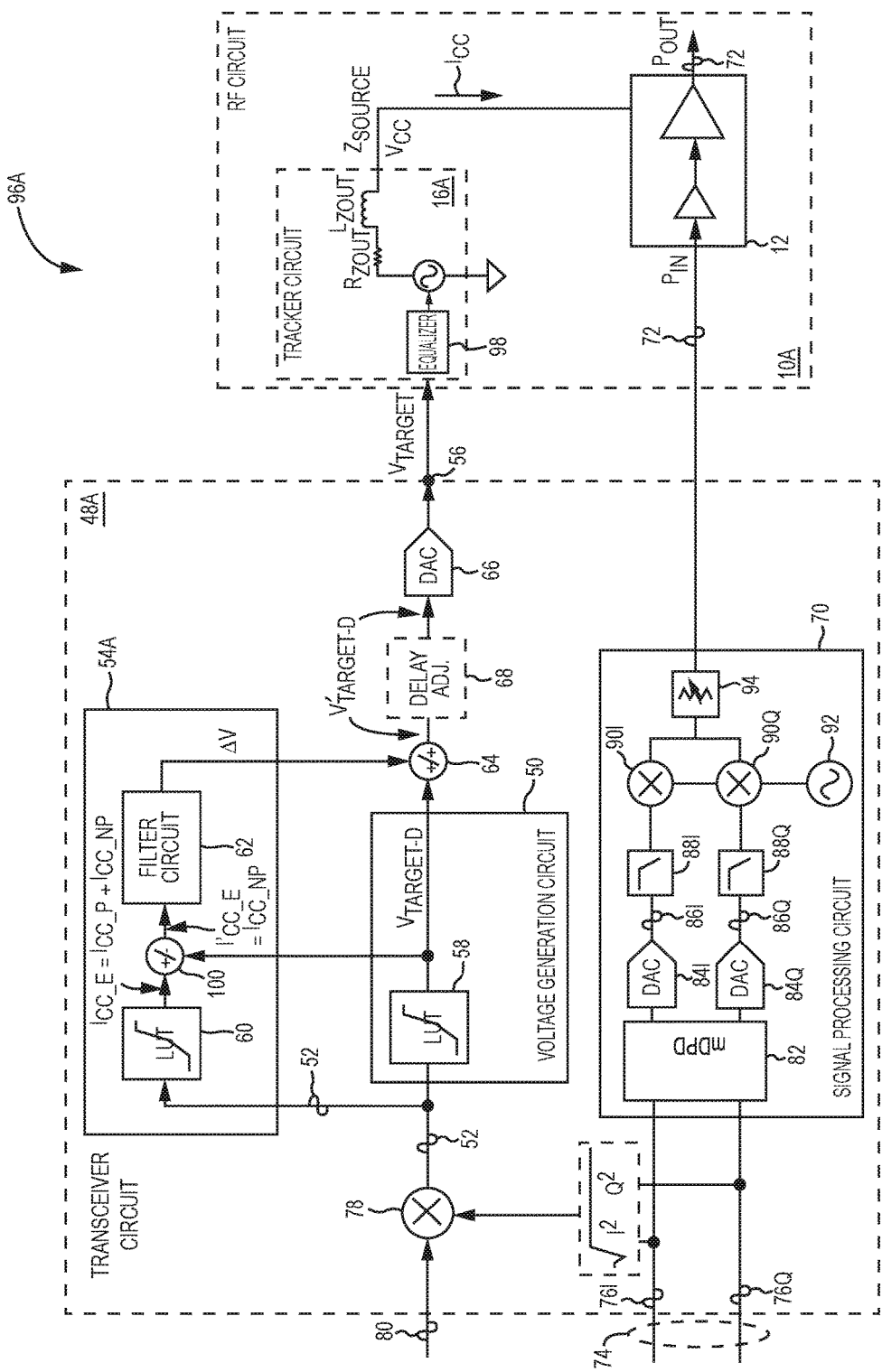
FIG. 4 is a schematic diagram of an exemplary apparatus configured according to another embodiment of the present disclosure.

In the equation (Eq. 3), $R_{ICC}$ presents an equivalent resistance of the power amplifier circuit 12 ($R_{ICC} = V_{CC}/I_{CC\_P}$). As such, it may be possible to generate a voltage correction term, which equals $1/(1+Z_{SOURCE}/R_{ICC})$, in the tracker circuit 16 to compensate for the voltage distortion associated with the first voltage term $V_{TERM1}$, while still compensating the voltage distortion associated with the second voltage term VTERM2 based on the voltage compensation term $\Delta v$. In this regard, FIG. 4 is a schematic diagram of an exemplary apparatus 96A configured according to another embodiment of the present disclosure. Common elements between FIGS. 1A, 2, 3, and 4 are shown therein with common element numbers and will not be re-described herein.

The apparatus 96A includes an RF circuit 10A that includes the power amplifier circuit 12 and a tracker circuit 16A. The tracker circuit 16A may include an equalizer (e.g., frequency equalizer) 98 that can be configured to generate the voltage correction term to compensate for the voltage distortion associated with the first voltage term $V_{TERM1}$.

The apparatus 96A includes a transceiver circuit 48A, which includes a voltage compensation circuit 54A. The voltage compensation circuit 54A includes a subtractor 100 coupled between the load current LUT 60 and the filter circuit 62. The subtractor 100 is configured to subtract the proportional load current $I_{CC\_P}$ from the estimated load current $I_{CC\_E}$ to generate a modified estimated load current $I'_{CC\_E}$ including only the non-proportional load current $I_{CC\_NP}$. Accordingly, the filter circuit 62 is configured to generate the voltage compensation term $\Delta v$ to compensate for the voltage distortion associated with the second voltage term $V_{TERM2}$.

Those skilled in the art will recognize improvements and modifications to the preferred embodiments of the present disclosure. All such improvements and modifications are considered within the scope of the concepts disclosed herein and the claims that follow.

What is claimed is:

1. A transceiver circuit comprising:
   an output node coupled to a radio frequency (RF) circuit;
   a voltage generation circuit coupled to the output node and configured to:
      receive a plurality of digital amplitudes; and
      generate a digital target voltage based on the plurality of digital amplitudes; and
   a voltage compensation circuit provided in parallel to the voltage generation circuit and configured to generate a voltage compensation term based on the plurality of digital amplitudes;
   wherein the digital target voltage is combined with the voltage compensation term prior to the digital target voltage being converted into an envelope tracking (ET) target voltage at the output node.

2. The transceiver circuit of claim 1 wherein the voltage compensation circuit comprises:
   a load current look-up table (LUT) configured to generate an estimated load current based on the plurality of digital amplitudes; and
   a filter circuit configured to generate the voltage compensation term based on the estimated load current.

3. The transceiver circuit of claim 2 wherein the filter circuit is further configured to:
   receive the estimated load current from the load current LUT; and
   perform a convolution function based on the estimated load current and a set of estimated source impedance impulse responses corresponding to the RF circuit to generate the voltage compensation term.

4. The transceiver circuit of claim 2 wherein the estimated load current comprises a proportional load current and a non-proportional load current.

5. The transceiver circuit of claim 4 wherein the voltage compensation circuit is further configured to subtract the proportional load current from the estimated load current prior to generating the voltage compensation term.

6. The transceiver circuit of claim 2 wherein the voltage generation circuit comprises a target voltage LUT configured to generate the digital target voltage based on the plurality of digital amplitudes.

7. The transceiver circuit of claim 6 further comprising:
   a voltage combiner configured to combine the digital target voltage and the voltage compensation term to generate a compensated digital target voltage; and
   a digital-to-analog converter (DAC) configured to:
      convert the compensated digital target voltage into the ET target voltage; and
      provide the ET target voltage to the output node.

8. An apparatus comprising:
   a transceiver circuit comprising:
      an output node;
      a voltage generation circuit coupled to the output node and configured to:
         receive a plurality of digital amplitudes; and
         generate a digital target voltage based on the plurality of digital amplitudes; and
      a voltage compensation circuit provided in parallel to the voltage generation circuit and configured to generate a voltage compensation term based on the plurality of digital amplitudes;
      wherein the digital target voltage is combined with the voltage compensation term prior to the digital target voltage being converted into an envelope tracking (ET) target voltage at the output node; and
   a radio frequency (RF) circuit coupled to the output node and configured to receive the ET target voltage.

9. The apparatus of claim 8 wherein the RF circuit comprises:
   a tracker circuit coupled to the output node and configured to generate an ET modulated voltage based on the ET target voltage; and
   a power amplifier circuit configured to amplify an RF signal based on the ET modulated voltage.

10. The apparatus of claim 9 wherein the voltage compensation circuit comprises:
    a load current look-up table (LUT) configured to generate an estimated load current based on the plurality of digital amplitudes; and
    a filter circuit configured to generate the voltage compensation term based on the estimated load current.

11. The apparatus of claim 10 wherein the filter circuit is further configured to:
    receive the estimated load current from the load current LUT; and
    perform a convolution function based on the estimated load current and a set of estimated source impedance impulse responses corresponding to the RF circuit to generate the voltage compensation term.

12. The apparatus of claim 10 wherein the voltage generation circuit comprises a target voltage LUT configured to generate the digital target voltage based on the plurality of digital amplitudes.

13. The apparatus of claim 12 wherein the transceiver circuit further comprises:
    a voltage combiner configured to combine the digital target voltage and the voltage compensation term to generate a compensated digital target voltage; and
    a digital-to-analog converter (DAC) configured to:
       convert the compensated digital target voltage into the ET target voltage; and
       provide the ET target voltage to the output node.

14. The apparatus of claim 10 wherein the estimated load current corresponds to a load current in the power amplifier circuit caused by the ET modulated voltage and a source impedance coupled to the power amplifier circuit.

15. The apparatus of claim 14 wherein the estimated load current comprises a proportional load current and a non-proportional load current.

16. The apparatus of claim 15 wherein the ET modulated voltage comprises:
    a first voltage term corresponding to the proportional load current; and
    a second voltage term corresponding to the non-proportional load current.

17. The apparatus of claim 16 wherein the voltage compensation circuit is further configured to generate the voltage compensation term to compensate for a voltage distortion associated with the first voltage term and the second voltage term of the ET modulated voltage.

18. The apparatus of claim 16 wherein the voltage compensation circuit is further configured to subtract the proportional load current from the estimated load current prior to generating the voltage compensation term.

19. The apparatus of claim 18 wherein the voltage compensation circuit is further configured to generate the voltage compensation term to compensate for a voltage distortion associated with the second voltage term of the ET modulated voltage.

20. The apparatus of claim 19 wherein the tracker circuit comprises a frequency equalizer configured to generate a voltage correction term to compensate for the voltage distortion associated with the first voltage term of the ET modulated voltage.

21. A radio frequency (RF) circuit comprising:
   a power amplifier circuit configured to amplify an RF signal based on an envelope tracking (ET) modulated voltage comprising a first voltage term and a second voltage term; and
   a tracker circuit configured to:
      generate the ET modulated voltage based on an ET target voltage; and
      generate a voltage correction term to compensate for a voltage distortion associated with the first voltage term of the ET modulated voltage.

22. The RF circuit of claim 21 wherein the tracker circuit comprises an equalizer configured to generate the voltage correction term to compensate for the voltage distortion associated with the first voltage term of the ET modulated voltage.

23. The RF circuit of claim 21 wherein the RF circuit is coupled to a transceiver circuit, the transceiver circuit configured to generate a voltage compensation term to compensate the voltage distortion associated with the second voltage term of the ET modulated voltage.

* * * * *

UNITED STATES PATENT AND TRADEMARK OFFICE
CERTIFICATE OF CORRECTION

PATENT NO. : 10,361,744 B1
APPLICATION NO. : 16/038277
DATED : July 23, 2019
INVENTOR(S) : Nadim Khlat It is certified that error appears in the above-identified patent and that said Letters Patent is hereby corrected as shown below:

In the Specification

In Column 8, Lines 28, 29, 40, 43, replace "761" with --76I--.

In Column 8, Line 42, replace "841" with --84I--.

In Column 8, Lines 44, 48, 52, 58, replace "861" with --86I--.

In Column 8, Line 47, replace "881" with --88I--.

In Column 8, Lines 50 and 54, replace "901" with --90I--.

Signed and Sealed this
Third Day of September, 2019

Andrei Iancu
*Director of the United States Patent and Trademark Office*